United States Patent [19]

Smith, Jr.

[11] 4,255,474

[45] Mar. 10, 1981

[54] COMPOSITE HAVING TRANSPARENT CONDUCTOR PATTERN

[75] Inventor: Elroy C. Smith, Jr., La Habra, Calif.

[73] Assignee: Rockwell International Corporation, El Segundo, Calif.

[21] Appl. No.: 109,935

[22] Filed: Jan. 4, 1980

Related U.S. Application Data

[63] Continuation of Ser. No. 925,245, Jul. 17, 1978, abandoned.

[51] Int. Cl.³ .................... B32B 5/00; B32B 17/06
[52] U.S. Cl. .................................. 428/46; 428/49; 428/141; 428/212; 428/432; 428/702; 428/941; 428/635; 428/642
[58] Field of Search .................. 427/108, 109, 110; 428/49, 432, 539, 46, 141, 212

[56] References Cited

U.S. PATENT DOCUMENTS

| | | | |
|---|---|---|---|
| 2,932,590 | 4/1960 | Barrett | 427/108 |
| 2,971,867 | 2/1961 | Lytle | 428/432 |
| 3,455,722 | 7/1969 | Kushihashi | 428/432 |
| 3,814,501 | 6/1974 | Schindler | 350/160 LC |
| 3,944,684 | 3/1976 | Kane | 427/109 |
| 3,957,029 | 5/1976 | Nozik | 428/432 |
| 4,010,291 | 3/1977 | Katsube | 427/126 |
| 4,025,944 | 5/1977 | Moon | 357/67 |
| 4,048,372 | 9/1977 | Ando | 428/539 |

FOREIGN PATENT DOCUMENTS

| | | | |
|---|---|---|---|
| 647126 | 9/1961 | Canada | 427/108 |
| 2411872 | 9/1974 | Fed. Rep. of Germany | 427/108 |

OTHER PUBLICATIONS

Seki et al., IBM Technical Disclosure Bulletin, vol. 6, No. 5, Oct. 1963, p. 68.

*Primary Examiner*—James R. Hoffman
*Attorney, Agent, or Firm*—H. Fredrick Hamann; Gilbert H. Friedman

[57] ABSTRACT

A continuous layer of transparent material is formed on a base. A desired pattern of transparent electrically conductive material is included in the layer. The regions of the layer not included in the conductor pattern are insulative. The insulative material is preferably an indium oxide. Tin is preferably used as a dopant in the indium oxide to made it electrically conductive according to the desired pattern. The electrically conductive pattern is first formed in metallic tin. The tin pattern is diffused into a layer of metallic indium. The layer is then thermally oxidized to form the electrically conductive pattern as indium-tin-oxide (ITO) in indium sesquioxide, $In_2O_3$, an insulator.

6 Claims, 5 Drawing Figures

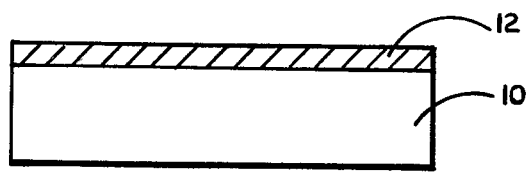
FIG. IA
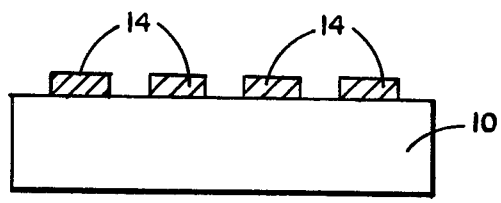
FIG. IB
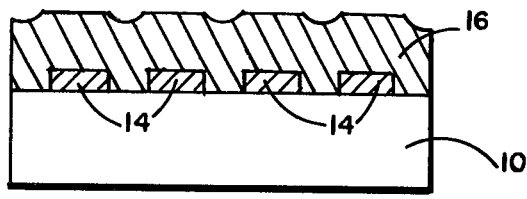
FIG. IC
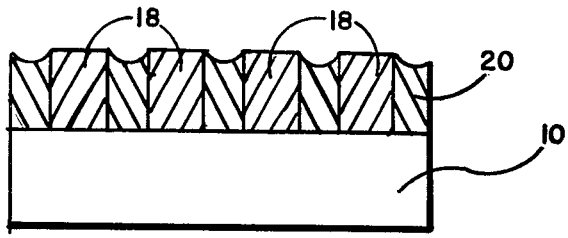
FIG. ID
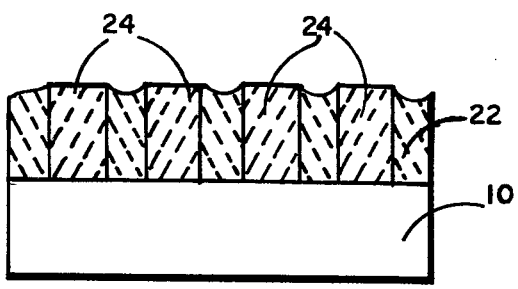
FIG. IE

COMPOSITE HAVING TRANSPARENT CONDUCTOR PATTERN

This is a continuation, of application Ser. No. 925,245 filed Jul. 17, 1978, now abandoned.

BACKGROUND OF THE INVENTION

1. Field of the invention

This invention relates to transparent electrically conductive material systems.

2. Description of the Prior Art

Layers, coatings, and thin films of metal oxides which are electrically conductive are well known. These have been used extensively in the fabrication of, for example, display devices such as liquid-crystal displays wherein some of the electrodes are required to be transparent so as not to impair the viewability by an observer of the displayed information. For an example of this application, see Schindler, U.S. Pat. No. 3,814,501. The most frequently encountered metal oxides used for this purpose are oxides of indium, tin, and of indium and tin together (indium-tin-oxide or ITO). Schindler discloses patterns of transparent, electrically conductive material in a liquid-crystal display where the conductive material is indium oxide or tin oxide or a combination of these materials.

Another application for transparent electrical conductors is as electrodes for gate structures which are fabricated on such semiconductor devices as charge-coupled imagers.

In both the imager device and the display device applications, the practice has been to form the conductor pattern as a separate, discontinuous entity. Typically, the pattern has been formed by depositing metallic oxide material and then using photolithographic techniques to conform the metallic oxides to a desired conductor pattern although various other approaches such as, for example, printing have also been used. For an example of the latter, see Laurie, (West German) Offenlegungsschrift No. 2,411,872.

Where a conductor pattern of, for example, ITO is formed as a separate entity on an imager or display device, at least two distinct types of paths are created for light which is incident on the device. In one type of path, a light beam passes through the thickness of the ITO once or twice depending on whether or not it is reflected. In the other type of path, which does not pass through an ITO layer, the light typically travels a longer distance through air-filled space. The difference between the indexes of refraction of the air and ITO and the difference in the number of interfaces traversed by a light beam depending on the path traveled produces distortion in the image sensed or reflected. The subject invention greatly reduces these differences thereby reducing the resultant distortion.

Barrett et al, U.S. Pat. No. 2,932,590, discloses the controlled deposition of metallic indium and tin and the subsequent thermal oxidation thereof to produce thin, transparent, electrically conductive coatings. However, Barrett et al does not disclose the formation of a pattern of electrical conductors included in an insulative film as disclosed herein.

SUMMARY OF THE INVENTION

The present invention provides a pattern of transparent electrically conductive material deposited on a substrate, a semiconductor device, or the like, wherein the pattern of electrically conductive material is included in an otherwise continuous layer of transparent insulative material having substantially the same index of refraction as the electrically conductive material, the layer having substantially the same thickness throughout. Similar optical paths are provided for light passing through conductor material and for light passing through insulator material because length and propagation time differences for light rays passing through the two different types of material are made small.

In the preferred embodiment, the insulator material is an indium oxide, more particularly indium sesquioxide ($In_2O_3$). In order to make the ratio of the resistivity of the insulator material to the resistivity of the conductor material high, the insulative indium oxide is preferably made to be relatively free of impurities and substantially stoichiometric. Impurities and deficiencies of oxygen ions provide free charge carriers and are undesirable for that reason.

Regions of the layer of insulator material are modified to make them electrically conductive in a pattern conforming to the desired conductor pattern. In the preferred embodiment, tin is used as a dopant to modify the insulator material.

Both the tin and indium are initially deposited on the substrate or device in elemental, or metallic, form. The tin is conformed to the desired pattern for the electrical conductors. The tin is then diffused, or alloyed, into the indium and the material system is oxidized.

Elemental materials are obtainable in significantly higher purities than are, for example, metallic oxides. By working with initially metallic tin and indium then, the purities of the materials used in practicing this invention can be made consistent with the requirements of semiconductor technology wherein even small amounts of contaminants are known to cause degradation of device parameters.

As another advantage of the subject invention, it will become apparent that smaller electrical conductor linewidths can be implemented in the subject invention than have been conveniently possible to implement in the prior art. That is because the conductor pattern is first formed in a thin layer of modifying material, such as the tin mentioned above, which is significantly thinner than the finally formed conductors. Thin layers can be etched to smaller linewidths because the reduced time required for etching greatly reduces undercut.

BRIEF DESCRIPTION OF THE DRAWINGS

FIGS. 1A–1E are schematic diagrams showing, in sectional views, stages in the formation of conductors according to a preferred embodiment of the invention.

DETAILED DESCRIPTION OF THE PREFERRED EMBODIMENTS

Referring first to FIG. 1A, a base 10 is shown on which there is deposited a layer 12 of a modifying material. The base 10 may be, for example, a glass substrate used as a cover plate for a liquid-crystal display device wherein transparent electrodes are desired. As another example, the base 10 may be a semiconductor integrated circuit device such as a CCD imaging device wherein transparent conductors are used in the gate structure. In the preferred embodiment, the modifying material deposited is metallic tin. High purity tin may be preferred for use in cases where the base is, for example, a semiconductor device, as mentioned above, and where properties of the semiconductor device may be adversely affected by impurites in the tin. Metallic tin having a purity as high as 99.999% may be readily obtained and used in practicing this invention.

In the preferred embodiment, the metallic tin is preferably deposited using standard sputtering techniques well known to those skilled in the art. A suitable power level for rf sputtering of tin is about 150 watts. A suitable gas pressure for the argon contained in the sputtering chamber is 8±2 microns.

Instead of sputtering, however, any of the various other standard techniques for the deposition of metals may be used, if so desired, for the deposition of the layer 12 of tin. These other techniques include, for example, plating, plasma coating, vacuum vapor deposition, pyrolytic coating, thermal evaporation, and electron-beam evaporation.

A preferred thickness for a completed layer of transparent material formed in accordance with this invention is about 1000 angstroms. This thickness represents a compromise providing adequately high conductivity for the conductive regions of the completed layer and adequately high resistivity for the insulative regions of the completed layer in electronic applications, such as in display or imaging devices, along with high light transmittance. For a completed layer thickness of 1000 angstroms, the preferred thickness for the deposited layer 12 of tin is 75±25 angstroms. Thus, it is seen that in the preferred embodiment the layer 12 of modifying material has a thickness only 10%, or less, or the thickness of the completed layer.

After the layer 12 of modifying material is deposited on the base 10 as shown in FIG. 1A, the layer 12 is formed, or delineated, into a pattern conforming to a desired pattern for electrical conductors. The result is illustrated in FIG. 1B wherein individual elements 14 of modifying material are shown disposed on the base 10 and positioned thereon in the desired locations for conductors. A plurality of individual elements 14 are shown in FIG. 1B for the sake of illustration only. It will be recognized by those skilled in the art that the subject invention is equally applicable to cases where a desired conductor pattern has but a single unitary conductor structure.

Where the modifying material is tin, the individual elements 14 are preferably conformed to the desired conductor pattern by standard photolithography techniques well known to those skilled in the art. For example, a suitable photoresist for this purpose is manufactured and sold under the trademark Kodak #809 by the Eastman Kodak Company of Rochester, New York. The photoresist is preferably baked at a relatively low temperature, for example no higher than about 90° C., to prevent diffusion of the tin into the photoresist. A suitable etchant for the tin is a mixture of 12.5 grams of ammonium fluoroborate, 2.25 liters of concentrated nitric acid, 0.2 liters of concentrated fluoroboric acid and 150 liters of deionized water. Using this etchant, the elements 14 can be formed in the tin in about 20 seconds.

It is well known that patterns delineated by photolithographic techniques are limited in their definition by reason of the undercut produced by etchants. However, in the method of forming the desired electrical conductor pattern described thus far, the pattern is formed in a layer 12 having a thickness 10% or less, of the thickness of the completed layer of transparent material in which the pattern for electrical conductors will ultimately be included, as discussed hereinbelow. It is clear then that a conductor pattern having finer definition (smaller linewidths and smaller line-to-line spacing) can be photolithographically produced in conjunction with the practice of this invention than can be produced in the case where a pattern is required to be formed in a layer having the greater thickness of the completed layer of transparent material. The latter case represents the situation in the prior art where layers of conductive metallic oxides are etched to form the desired pattern of electrical conductors.

Although photolithographic techniques are preferred for forming the elements 14 into the desired conductor pattern, other approaches may be used consistent with the invention. For one example, the modifying material may be deposited through a mask thus forming the elements 14 of FIG. 1B immediately. This approach may be more desirable where the elements 14 are to be established on a base having sharp corners or steps to which the elements 14 are required to conform. As yet another example, the modifying material may be disposed in an ink which is screen printed onto the base in the desired pattern. Using either of these two techniques for forming the elements 14 may have the result of reducing the number of steps required to form a completed layer inasmuch as an undelineated layer of modifying material such as the layer 12 of FIG. 1A is not required to be deposited.

As shown in FIG. 1C, the elements 14 of modifying material, after being formed, are covered with a layer 16 of a material which is both oxidizable into a transparent insulative material when relatively pure and oxidizable into a transparent conductive material when combined with a suitable modifying material. Metallic indium having a purity of at least about 99.9% by weight, is the preferred oxidizable material for use with tin in practicing this invention. As with the tin used to form the layer 12 of modifying material in FIG. 1A, a greater purity for the indium may be preferred for use in cases where the base is, for example, a semiconductor device and where properties of the semiconductor device may be adversely affected by impurites in the indium. Metallic indium having a purity as high as 99.999% by weight may be readily obtained and used in practicing this invention.

An additional reason exists for using a relatively higher purity indium. Oxidized indium is to serve as an insulator in a completed layer of transparent material conforming to the invention. Impurities in the indium will tend to provide free charge carriers and thereby decrease the electrical resistivity of the indium oxide. The extent to which decreased resistivity of the insulative indium oxide due to impurities is a problem depends, in part, on the application for which the invention is practiced. Where the completed material system is relatively large, where the desired pattern for the conductive regions thereof provides relatively large conductors spaced relatively far apart, satisfactory performance may be obtainable with a relatively low ratio of the resistivity of the insulative material to the resistivity of the conductive material. On the other hand, for applications involving microelectronic circuitry and highly precise definition of small conductors, a ratio of the resistivity of the insulative material to the resistivity of the conductive material as high as it is practicable to obtain is preferred. For the latter situation, the greater the purity of the metallic indium used, the greater the ratio of resistivities will tend to be. A ratio of resistivity of insulative material to resistivity of conductive material as high as $10^6$ has been obtained in practicing the subject invention using indium having a purity of about 99.999% by weight.

In the preferred embodiment, the metallic idium is preferably deposited using standard sputtering techniques well known to those skilled in the art. A suitable power level of rf sputtering of indium is about 175±25 watts. A suitable gas pressure for the argon contained in the sputtering chamber is 8±2 microns.

Instead of sputtering, however, any of the various other standard techniques for the deposition of metals may be used, if desired, for the deposition of the layer 16 of indium. As was mentioned above in connection with the discussion of techniques for depositing tin, those other techniques include, for example, plating, plasma coating, vacuum vapor deposition, pyrolytic coating, thermal evaporation, and election-beam evaporation.

For that preferred embodiment wherein the completed layer of transparent material has a thickness of about 1000 angstroms and wherein the layer 12 of tin, as shown in FIG. 1A, is 75±25 angstroms thick, the preferred thickness for the layer 16 of indium is about 700 angstoms.

The layer 16 of indium must cover the entire area on the base 10 for which it is desired to have a coating of transparent material. Inasmuch as the deposition of the layer 16 of indium may have covered portions of the base 10 over which no coating of transparent material is desired, photolithographic forming techniques may be used to remove the indium from those portions. Such would be the case, for example, where access to pads on an underlying semiconductor device was required to be made available for connection to interface circuitry not provided by the procedures of this invention. In this event, the layer 16 of indium is preferably formed using the same photoresist and the same etchant described above in connection with the discussion of forming the elements 14 as shown in FIG. 1B. Approximately two minutes is required to etch this indium layer 16 using the aforementioned etchant.

After the elements 14 of modifying material are covered with a coating of oxidizable material 16 as shown in FIG. 1C, the modifying material is diffused into the oxidizable material. This may be accomplished in an oven having either an inert or a reducing atmosphere. Where the materials are preferred dopant, tin, and the preferred oxidizable material, indium, the diffusion, or alloying, is preferably accomplished by heating in a reducing atmosphere of about 85% nitrogen and 15% hydrogen.

FIG. 1D illustrates the result of the diffusion of the tin into the indium in regions 18 throughout the depth of the layer 20. The regions 18 of the layer 20 conform to the desired pattern for electrical conductors while the remaining portions of the layer 20 are intended to be occupied by insulative material.

The definition of the conductor pattern to which the regions 18 of alloyed material can be required to conform is limited by a need to maintain a certain minimum spacing for insulation between the conductors. The spacing obtained between regions 18 of alloyed material is dependent both upon the spacing provided between the elements 14 of modifying material, as shown in FIGS. 1B and 1C, and upon the manner in which the diffusion of the modifying material into the oxidizable material is carried out. The spacing between the adjacent edges of the elements 14 of modifying material, as shown in FIGS. 1B and 1C, is preferably at least about ten times the thickness to which the layer 16 of oxidizable material is deposited. For a layer 16 having a thickness of, for example, 700 angstroms, the preferred spacing between the elements 14 is preferably at least 7000 angstroms, or about one micron. This spacing lower limit is consistent with the minimum line-to-line spacing which is reasonably obtainable for a 700 angstrom layer by photolithographic techniques.

The extent to which the modifying material is diffused into the oxidizable material is determined, in part, by the parameters of the heating operation used to produce the diffusion. In the preferred embodiment, the alloying of the tin and indium is accomplished at a temperature of 200°±20° C. for 30±10 minutes. The diffusion must be limited since heating for too long a time or at too high a temperature, or both of these, will ultimately result either in conductors having too little spacing between them or, eventually, in the modifying material being uniformly distributed throughout the entire layer 20 of FIG. 1D. In either case, the desired conductor pattern would be effectively eliminated. Heating at lower temperatures or for shorter times, or both of these, may prevent adequately good mixing of the indium and tin in the regions 18 of the layer 20.

It will be apparent to those skilled in the art that the procedural order described hereinabove for producing the material system illustrated in FIG. 1D, while it is preferred, is not exclusive. For example, the layer 16 of indium may be deposited first, before the layer 12 of tin, directly on the base 10. After the layer 16 of indium is formed, the tin layer 12 may be deposited and photolithographically formed on top of the indium layer 16 using well known lift-off techniques and employing a photoresist mask to protect the indium from etchant. Once the tin is diffused into the indium, the result will be as is illustrated in FIG. 1D.

The structure illustrated in FIG. 1D is converted to the one shown in FIG. 1E by heating the layer 20 in oxygen or air to oxidize it. The unmodified oxidizable material is converted to transparent insulative material in the completed layer 22 of FIG. 1E. The modified material of the regions 18 of FIG. 1D is converted to transparent electrically conductive material in the regions 24 of FIG. 1E.

Where the oxidizable material is the preferred metal indium, the transparent insulative material formed is an indium oxide. Complete oxidation to produce stoichiometric indium sesquioxide ($In_2O_3$) is believed to be preferable for the higher resistivity obtainable. Where the modifying material is tin, the indium-tin alloy is converted to indium-tin-oxide (ITO) a well known transparent electrical conductor wherein the tin acts as a dopant for the otherwise insulative indium oxide.

Stoichiometry of the indium sesquioxide is believed to be assured by heating for a sufficient time at a sufficiently high temperature. Heating in air at 480°±20° C. for from 30 to 120 minutes appears to give satisfactory results.

The transparent layer 22 of metallic oxide material grows in thickness while being oxidized. For a metallic layer originally about 700–800 angstroms thick, the oxide layer 22 of FIG. 1E will be about 1000 angstroms thick. The film growth from metal to metallic oxide is by a factor of from about 1.35 to about 1.45.

It is a goal to control the thickness of the indium and tin layers in order to achieve, after processing, a composition of the ITO which is approximately 90 mole percent of indium oxide and 10 mole percent of tin oxide.

This is the commonly accepted composition of the most conductive ITO.

Typical measured values obtained for the refractive index of the indium oxide have been in the range of from 1.7 to 1.8. Measured value for the refractive index of the ITO have been in the range from 1.9 to 2.0. Measured values for the resistivity of the indium oxide have ranged from 1000 ohm-cm to 10,000 ohm-cm while the resistivity of ITO produced by the subject invention has ranged from 0.01 ohm-cm to 0.02 ohm-cm.

While the invention has been described in its preferred embodiment, it is understood that the words which have been used are words of description rather than of limitation and that changes within the purview of the appended claims may be made without departing from the true scope and spirit of the invention in its broader aspects. For example, tin, when relatively pure, may be used as the material oxidizable to form transparent insulator material. Antimony may be used as a dopant to modify the tin oxide to be conductor material. As another example, cadmium as the modifying material may be diffused into tin serving as the oxidizable material. Oxidation of the cadmium-tin alloy will produce the compound cadmium stannate ($Cd_2SnO_4$) which is known to be highly conductive. Furthermore, those skilled in the art will recognize that the subject invention is not limited to a single layer of transparent material which includes regions of conductive material. A plurality of such layers may be formed in a stack if so desired. It may be desirable to separate the layers which include conductor material by other layers of insulator material only.

What is claimed is:

1. A composite comprising:
    an integrated circuit device of semiconductor material, and
    a substantially continuous layer of transparent material disposed on said integrated circuit device, said layer of transparent material having a first region therein of insulative material and a second region therein of electrically conductive material,
    wherein said second region is determined by diffusing a modifying material into a portion of a layer of a first metal disposed on said base whereby said first metal is alloyed with said modifying material;
    wherein said insulative material is an oxide of said first metal formed by oxidation of unalloyed parts of said layer of a first metal,
    wherein said electrically conductive material is an oxidation product of the alloyed portion of said layer of a first metal,
    wherein said first metal in said layer has a purity of at least about 99.9% by weight, and
    wherein said insulative material is a substantially pure and stoichiometric oxide of said first metal having a resistivity of at least about 1000 ohm-cm.

2. A composite as recited in claim 1 wherein the ratio of the resistivity of said insulative material to the resistivity of said electrically conductive material is at least about 50,000.

3. A composite as recited in claim 2 wherein said first metal is indium and wherein said modifying material is tin.

4. A composite as recited in claim 2 wherein said first metal is tin and said modifying material is antimony.

5. A composite as recited in claim 2 wherein said electrically conductive material is a compound of said first metal and said modifying material and wherein said compound is formed by oxidation of an alloy of said first metal with said modifying material.

6. A composite as recited in claim 5 wherein said first metal is tin and said modifying material is cadmium.

* * * * *

UNITED STATES PATENT AND TRADEMARK OFFICE
CERTIFICATE OF CORRECTION

PATENT NO. : 4,255,474
DATED : March 10, 1981
INVENTOR(S) : Elroy C. Smith, Jr.

It is certified that error appears in the above-identified patent and that said Letters Patent are hereby corrected as shown below:

Column 5, line 17, "election-beam" should be -- electron-beam --.

Signed and Sealed this

Eighth Day of September 1981

[SEAL]

Attest:

GERALD J. MOSSINGHOFF

Attesting Officer        Commissioner of Patents and Trademarks

UNITED STATES PATENT AND TRADEMARK OFFICE
CERTIFICATE OF CORRECTION

PATENT NO. : 4,255,474
DATED : March 10, 1981
INVENTOR(S) : Elroy C. Smith, Jr.

It is certified that error appears in the above-identified patent and that said Letters Patent are hereby corrected as shown below:

Column 8, line 6, "base" should be --integrated circuit device--.

Signed and Sealed this

Twenty-fourth Day of September 1985

[SEAL]

Attest:

DONALD J. QUIGG

Attesting Officer

Commissioner of Patents and Trademarks—Designate